United States Patent
Brox et al.

(10) Patent No.: US 7,203,102 B2
(45) Date of Patent: Apr. 10, 2007

(54) SEMICONDUCTOR MEMORY HAVING TRI-STATE DRIVER DEVICE

(75) Inventors: Martin Brox, München (DE); Russell Houghton, Essex Junction, VT (US); Helmut Schneider, München (DE); Sabine Kieser, Schliersee (DE)

(73) Assignee: Infineon Technologies, AG, Munich (DE)

( * ) Notice: Subject to any disclaimer, the term of this patent is extended or adjusted under 35 U.S.C. 154(b) by 95 days.

(21) Appl. No.: 10/974,019

(22) Filed: Oct. 27, 2004

(65) Prior Publication Data

US 2006/0087896 A1   Apr. 27, 2006

(51) Int. Cl.
G11C 7/10   (2006.01)
(52) U.S. Cl. ............ 365/189.04; 365/189.08; 365/189.09; 365/207
(58) Field of Classification Search .......... 365/189.04, 365/189.08, 189.09, 207
See application file for complete search history.

(56) References Cited

U.S. PATENT DOCUMENTS 6,205,071 B1 *  3/2001  Ooishi .................. 365/207
6,272,062 B1 *  8/2001  Mueller et al. ........ 365/230.02
6,515,892 B1 *  2/2003  Itoh et al. .............. 365/149
6,819,613 B2 * 11/2004  Takemura et al. ........ 365/205

FOREIGN PATENT DOCUMENTS

EP   0 179 651 B1   2/1990

OTHER PUBLICATIONS

Itoh, K. (2001). *VLSI Memory Chip Design* Springer, pp. 15-17.

* cited by examiner

*Primary Examiner*—Tuan T. Nguyen
*Assistant Examiner*—Toan Le
(74) *Attorney, Agent, or Firm*—Morrison & Foerster LLP

(57) ABSTRACT

A semiconductor memory having at least one memory cell adapted to store a data value, and adapted to be connected to a data line through a switch device controlled by a control signal. The invention also relates to a tri-state driver device for driving the control signal. Further, there is a method for operating a memory, in which the memory has a memory cell adapted to store a data value, and adapted to be connected to a data line through a switch device controlled by a control signal.

23 Claims, 3 Drawing Sheets

SEMICONDUCTOR MEMORY HAVING TRI-STATE DRIVER DEVICE

TECHNICAL FIELD OF THE INVENTION

The invention relates to a semiconductor memory, and in particular to a DRAM (Dynamic Random Access Memory).

BACKGROUND OF THE INVENTION

In DRAMS, respective memory cells may e.g. consist substantially of capacitors. The memory cells/capacitors are connected to bit lines which serve to transmit a data value to be read out from the memory cell or a data value to be read into the memory cell.

On the reading out of a memory cell, an access transistor that is connected with the capacitor of a memory cell is connected through by the activation of a word line, and the charge condition stored in the capacitor is applied to the bit line.

Subsequently, the weak signal emanating from the capacitor is amplified by a read amplifier ("sense amplifier"). The read amplifier comprises complementary signal inputs. The bit lines connected to these signal inputs are referred to as bit line and complementary bit line.

In today's DRAMS, the read amplifiers may be used as "divided parts" so as to save chip space. In so doing, a read amplifier is used both during the reading out of a memory cell positioned at the left and a memory cell positioned at the right side along respective bit lines associated with a read amplifier (hence, the read amplifiers are used as so-called "shared sense amplifiers").

Prior to the reading out of the memory cells, the corresponding bit line sections, i.e. the corresponding sections of the non-complementary bit line and of the complementary bit line, are, by so-called precharge/equalize circuits that are connected with the bit lines, precharged to the same potential, which corresponds to half the voltage of a bit line in a logic high state (i.e., to VBLH/2). This ensures that—prior to the reading out of data—no differences occur between the potential of the section of the bit line and the section of the corresponding complementary bit line, which otherwise might superimpose the small amount of charge transferred by the capacitor of a memory cell to the bit lines during reading out. Directly prior to the reading out of the memory cells the precharge-/equalize circuits which are connected to the bit line sections that are adapted to be connected with the memory cell to be read out are switched off.

Known DRAMS moreover comprise isolation circuits with isolation transistors, which serve to decouple the read amplifier during the reading out of the memory cells from the side/bit line sections that is/are not connected to memory cells to be read out.

Each isolation circuit e.g. might consist of two NMOS-FETs, the source-drain paths of which are adapted to interrupt the corresponding bit line sections.

With known DRAMs, outside the read and write cycles, respective bias voltages are applied to the gates of the isolation transistors of the isolation circuits. These bias voltages might e.g. correspond to a voltage (VINT) generated internally on the DRAM chip.

Directly prior to the reading out of a memory cell the side of the read amplifier that is connected with memory cells not to be read out is coupled off the respective bit line section(s) by the gates of the respective isolation transistors positioned on this side of the read amplifier being put to ground. Simultaneously, the other side of the read amplifier may be coupled in an improved manner to the respective bit line section(s) by the gate voltage that is applied to the gates of the isolation transistors positioned on the other side of the read amplifier being slightly increased e.g. from its above initial value VINT to a voltage value VPP.

The actual reading out of the memory cell is initiated shortly thereafter by appropriate word line signals connecting through the access transistors that are connected with the memory capacitors. Subsequently, appropriate activating voltages are applied to the read amplifier, whereupon the read amplifier amplifies the potential differences transferred from the memory capacitors to the corresponding bit line sections, and outputs a respective amplified differential signal.

The respective amplified differential signal is transmitted from the read amplifier to respective local data lines, the local data lines being adapted to be coupled to the read amplifier by respective transistors ("bit switches").

To connect the local data lines to the read amplifier, a control signal CSL applied to the gate of the above transistors (bit switches) is driven to a logic high state (e.g., to the above voltage VINT), such that the respective transistors (bit switches) are connected through.

The above amplified differential signal is transmitted from the local data lines to respective global data lines, and to a further amplifier (so-called "secondary sense amplifier") for further amplification.

The driver circuit for the above control signal CSL applied to the gate of the above transistors (bit switches) might be a simple inverter which allows switching of the CSL signal between 0V and e.g. VINT.

For the above reading out of memory cells ("read access"), both local data lines (called e.g. LocalData-Line_t and LocalDataLine_c) associated with a respective read amplifier might first be pre-charged to a voltage level of e.g. VBLH (with VBLH e.g. being smaller than VINT).

When CSL is asserted, a first of the above local data lines (e.g. the LocalDataLine_c) might then—depending on the state of the read amplifier—be slowly discharged through the respective bit switch transistor, the resulting differential signal (as said above) being passed on to the above global data lines, and to the above further amplifier (secondary sense amplifier).

To write data onto the memory cells ("write access"), e.g., to write a "0", a second one of the above local data lines (e.g. the LocalDataLine_t) associated with the above read amplifier might be forced to 0V, whilst the other one of the above local data lines (e.g. the Local-DataLine_c) might still be held at the above pre-charge voltage level of e.g. VBLH.

The logic low voltage level of the above LocalDataLine_t is forced onto a respective one of the (pair) of bit lines associated with the respective read amplifier, which causes the read amplifier to flip.

As can be seen from the above description, the bit switches are operated bi-directionally (in a first direction for a read, and in a second direction for a write access).

For a write access, it must be ensured that the bit switches drive sufficient current. Otherwise, the read amplifier cannot be flipped fast enough (in particular, within the time period when CSL is in a logic high state).

However, during a read access, excessive current drive of the bit switches might disturb the signals on the bit line pair associated with the respective read amplifier, potentially causing the read amplifier to switch, and destroying the information to be read out of the memory cells.

To overcome the above problems, the bit switches have to be sized appropriately, and—potentially—the CSL signal has to be delayed, leading to a decreased performance, in particular, to an increase in the respective (total) access times for the respective memory.

It is therefore an object of the invention to provide an improved semiconductor memory and an improved method for operating a memory. In particular, it is an object of the invention to provide a semiconductor memory with an improved performance compared with semiconductor memories according to the state of the art.

SUMMARY OF THE INVENTION

According to one embodiment of the invention a semiconductor memory is provided comprising at least one memory cell adapted to store a data value, and adapted to be connected to a data line through a switch device controlled by a control signal, further comprising a tri-state driver device for driving the control signal.

In one preferred embodiment, the control signal is a tri-state signal.

The tri-state control signal may be adapted to be switched between a first, a second and a third voltage level.

Advantageously, the first voltage level is a logic low voltage level, the second voltage level is a first logic high voltage level, and the third voltage level is a second logic high voltage level different from the first logic high voltage level.

In one advantageous embodiment, during a read operation the first logic high voltage level is used, and during a write operation the second logic high voltage level is used.

Advantageously, the first logic high voltage level is lower than the second logic high voltage level.

According to a further embodiment of the invention, a method for operating a memory is provided, the memory comprising a memory cell adapted to store a data value, and adapted to be connected to a data line through a switch device controlled by a control signal, the method comprising the steps:

driving the control signal at a first voltage level when a read operation is to be performed; and driving the control signal at a second voltage level different from the first voltage level when a write operation is to be performed.

Advantageously, the first voltage level used for the read operation is lower than the second voltage level used for the write operation.

Thus, the write operation may be performed safely whilst the risk of a data corruption during the read operation is limited.

Further features and advantages of the present invention, as well as the structure and operation of various preferred embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes, circuits and steps have not been described in detail in order not to unnecessarily obscure the present invention.

Figure 1:
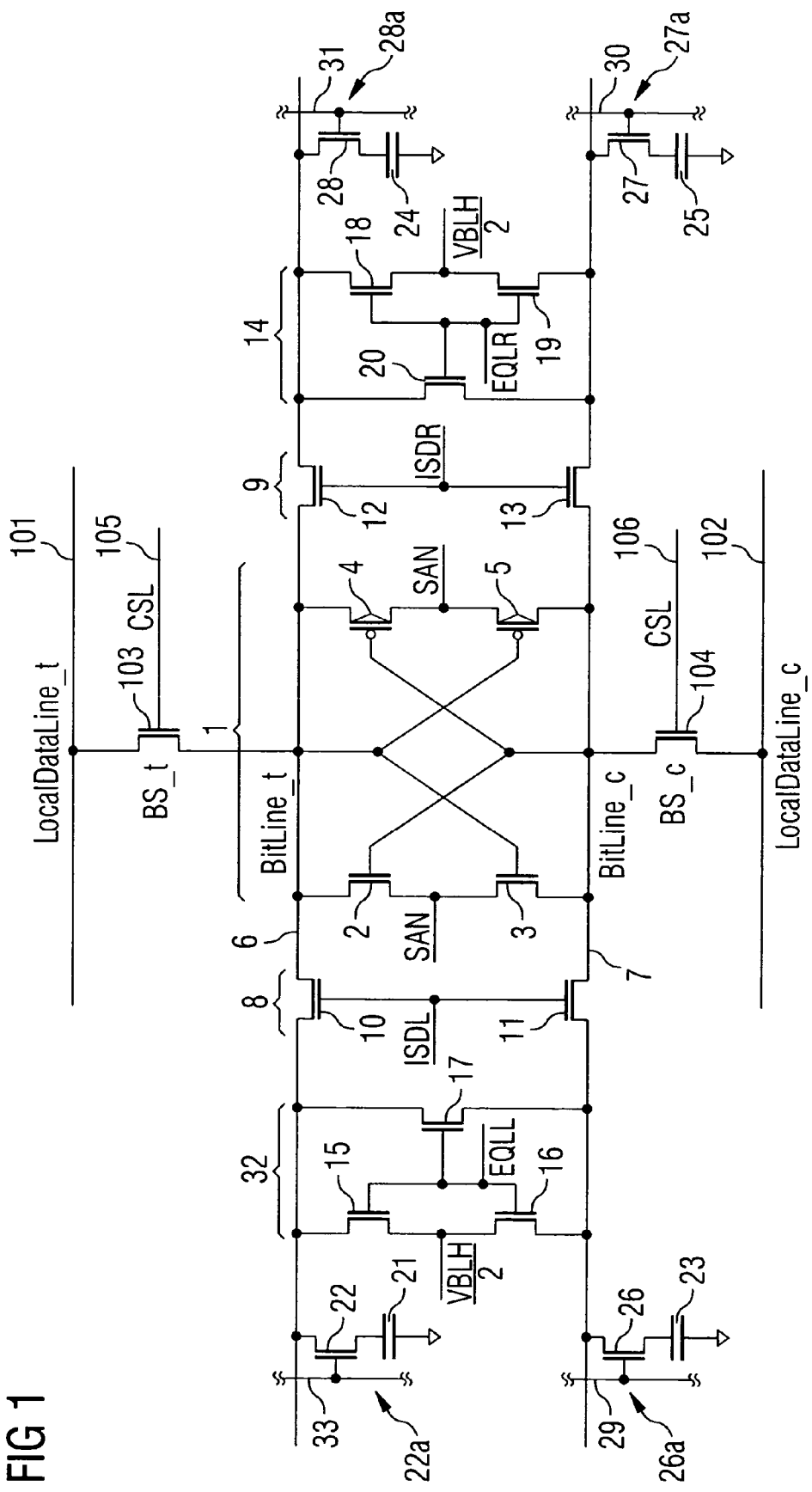
FIG. 1 shows a section of a DRAM.

FIG. 1 shows a section of a DRAM, comprising a read amplifier 1 consisting of two NMOS-FETs 2 and 3 and two PMOS-FETs 4 and 5, connected in the manner of a flip-flop. One end of the source-drain path of the first NMOS-FET 2 is connected with a bit line 6 (BitLine_t). In addition, the gate of the first NMOS-FET 2 is connected with a further bit line 7 (BitLine_c) complementary to the bit line 6. Further, the other end of the source-drain path of the first NMOS-FET 2 is connected with an end of the source-drain path of the second NMOS-FET 3, the source-drain path of which is connected at its other end with the complementary bit line 7. In addition, the gate of the second NMOS-FET 3 is connected with the bit line 6.

One end of the source-drain path of the first PMOS-FET 4 is connected with the bit line 6. In addition, the gate of the first PMOS-FET 4 is connected with the complementary bit line 7. Further, the other end of the source-drain path of the first PMOS-FET 4 is connected with an end of the source-drain path of the second PMOS-FET 5, the source-drain path of which is at its other end connected with the complementary bit line 7. In addition, the gate of the second PMOS-FET 5 is connected with the bit line 6.

On activating the read amplifier 1, respective voltages SAN or SAP, respectively, are applied to the connection points of the source-drain paths of the two NMOS-FETs 2 and 3 and the two PMOS-FETs 4 and 5.

The read amplifier 1 as illustrated in FIG. 1 is known in the prior art and is, for instance, described in the book "VLSI Memory Chip Design" by Kiyoo Itoh, Publishing House Springer, Berlin, Heidelberg, New York, 2001, on pages 15–17. This section of the book, and the rest of this book is therefore expressly incorporated in this description by reference.

The read amplifier 1 is connected with an isolation circuit 8 and 9, respectively, at the left and at the right. The isolation circuits 8 and 9 consist of two NMOS-FETs 10, 11 and 12, 13, respectively, the source-drain paths of which are adapted to interrupt the bit lines 6 and 7 to decouple the corresponding side of the read amplifier 1 during reading out or writing in of data into or out of the memory cells positioned on the respective other side of the read amplifier 1.

The gates of the NMOS-FETs 10, 11 and 12, 13, respectively of the isolation circuits 8, 9 which are connected with one another can be triggered by a control voltage ISOL (in the case of the isolation circuit 8 positioned at the left of the read amplifier 1) or a control voltage ISOR (in the case of the isolation circuit 9 positioned at the right of the read amplifier 1), respectively.

The DRAM section illustrated in FIG. 1 in addition comprises two precharge/equalize circuits 32 and 14 which are illustrated in FIG. 1 at the left and at the right next to the isolation circuits 8 and 9. The precharge/equalize circuits 32 and 14 serve to charge the corresponding sections of the bit line 6 and of the complementary bit line 7—prior to the reading out or writing in of data out of or into a memory cell—to the same voltage, e.g. to a voltage that corresponds to half the voltage of a bit line in a logic high state (VBLH/2).

Each precharge/equalize circuit 32, 14 consists of three NMOS-transistors 15, 16, 17 or 18, 19, 20, respectively. The source-drain path of a first one of the three respective NMOS-transistors 17 or 20 of a respective precharge/equalize circuit 32, 14 is connected between the bit line 6 and the complementary bit line 7. The source-drain paths of the two other NMOS-transistors 15, 16 or 18, 19, respectively, are connected in series, with the series connection also being connected between the bit line 6 and the complementary bit line 7. As can be seen from FIG. 1, the above voltage VBLH/2 is available at the connection point of the source-drain paths of the two NMOS-transistors 15, 16 or 18, 19, respectively. The gates of the three NMOS-FETs 15, 16, 17 or 18, 19, 20, respectively, of the precharge/equalize circuits 32, 14 are connected with one another and with a control voltage EQLL or EQLR, respectively, which is supplied by a control circuit (not illustrated in FIG. 1) for switching on and off the precharge/equalize circuits 32, 14. The precharge/equalize circuits illustrated in FIG. 1 are also known in the prior art and are, for instance, described in the above-mentioned section of the book by Itoh.

As can be seen from FIG. 1, a plurality of memory cells 22a, 26a, 27a, 28a (and further memory cells not shown in FIG. 1) are connected to each of the bit lines 6 and 7. The memory cells 22a, 26a, 27a, 28a each comprise a memory capacitor 21, 23, 24, 25 adapted to be connected with the bit line 6 or 7 via the source-drain path of a respective access transistor 22, 26, 27, 28 consisting of a NMOS-FET.

The access transistors 22, 26, 27, 28 are adapted to be triggered via respective word lines 29, 30, 31, 33.

As can be further seen from FIG. 1, a first local data line 101 ("LocalDataLine_t") is adapted to be connected—via the source-drain path of a respective transistor 103 ("bit switch") (here: an NMOS-FET BS_t)—to the bit line 6, and a second local data line 102 ("LocalDataLine_c") is adapted to be connected—via the source-drain path of a respective transistor 104 ("bit switch") (here: an NMOS-FET BS_c)—to the complementary bit line 7.

The transistors 103, 104 might—as will be explained in further detail below—be switched on and off (such that the bit lines 6, 7 are connected/disconnected from the local data lines 101, 102) by applying a respective control signal CSL to the gates of the transistors 103, 104 (e.g., via respective pairs of CSL control lines 105, 106).

Figure 2:
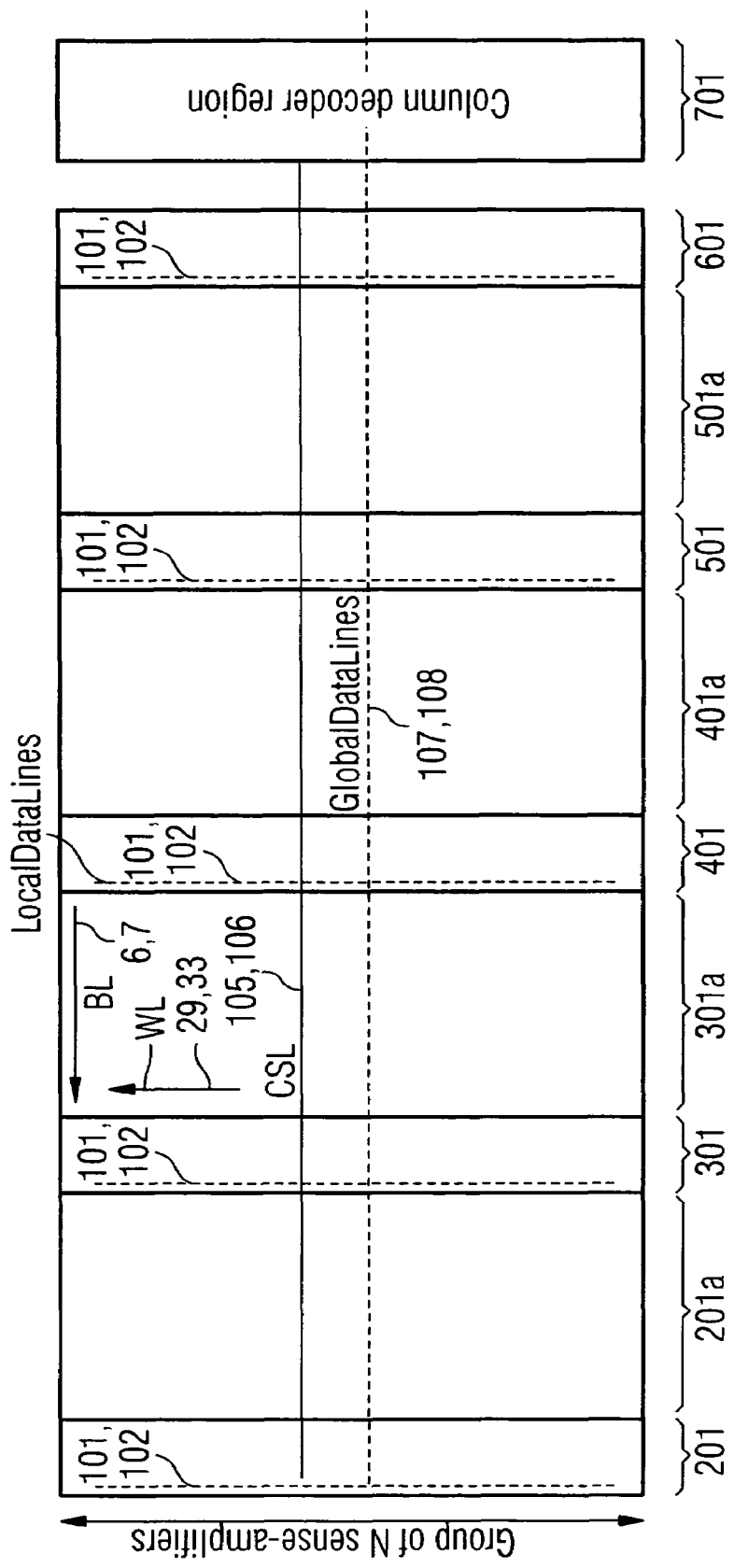
FIG. 2 shows an example for a section of a DRAM layout illustrating a possible arrangement of different parts used in an embodiment of the invention.

As is shown in FIG. 2, the above read amplifier 1 (together with several, e.g. N similarly built read amplifiers) might be arranged in one of several respective read amplifier regions 201, 301, 401, 501, 601 of the DRAM. On each of the read amplifier regions 201, 301, 401, 501, 601 for example N read amplifiers might be arranged.

Further, the above memory cells 22a, 26a, 27a, 28a might be arranged in respective cell field regions 201a, 301a, 401a, 501a, 601a of the DRAM (with the memory cells 22a, 26a which according to FIG. 1 are arranged to the left of the read amplifier 1 being arranged in the cell field region arranged to the left of the read amplifier region 201, 301, 401, 501, 601 in which the read amplifier 1 is located, and with the memory cells 27a, 28a which according to FIG. 1 are arranged to the right of the read amplifier 1 being arranged in the cell field region arranged to the right of the read amplifier region 201, 301, 401, 501, 601 in which the read amplifier 1 is located).

As is further illustrated in FIG. 2, the above local data lines 101, 102 are adapted to be coupled to respective global data lines 107, 108, which—starting from a respective column decoder region 701 of the DRAM—might run substantially in parallel to the above bit lines 6, 7 (and many other bit lines BL not shown) (and substantially rectangular to the above word lines 29, 33, 30, 31 (and many other word lines WL not shown)), and substantially in parallel to the above pairs of CSL control lines 105, 106 (and many other CSL control lines not shown) through the above read amplifier regions 201, 301, 401, 501, 601, and the above cell field regions 201a, 301a, 401a, 501a, 601a of the DRAM.

The number M of pairs of CSL control lines 105, 106 (with M e.g. being >10, 100 or 1000) might correspond to the above number N of sense amplifiers located in a respective one of the above read amplifier regions 201, 301, 401, 501, 601, or e.g. might be a fraction of it. For example, M=N/4 pairs of CSL control lines 105, 106 might be provided in the case that one pair of control lines 105, 106 serves to simultaneously control four associated columns of sense amplifiers (i.e.,—simultaneously—four different read amplifiers in the first read amplifier region 201, and four different read amplifiers in the second read amplifier region 301, etc.).

Referring again to FIG. 1, to read out data of a memory cell 22a ("read access"), the respective access transistor 22 is connected through by activating the respective word line 33 (leading to a through connection of all of the several access transistors 22, etc. connected to the respective word line 33, and arranged in one and the same row of the respective cell field region).

Thereby, the charge condition stored in the capacitor 22 of the respective memory cell 22a is applied to the respective bit line 6, 7.

Subsequently, the weak signal emanating from the capacitor 21 is amplified by the above read amplifier 1.

As is apparent from FIG. 1, the read amplifier 1 is a so-called "shared sense amplifier", used both during the reading out of a memory cell (e.g., the memory cell 22a) positioned at the left, and a memory cell (e.g., the memory cell 28a) positioned at the right side along the above bit lines 6, 7.

Prior to the reading out of a memory cell, corresponding bit line sections, i.e. corresponding sections of the non-complementary bit line 6, and of the complementary bit line 7 are precharged by a respective one of the above precharge/equalize circuits 32, 14 to the same potential, which e.g. corresponds to half the voltage of a bit line in the h-state (=VBLH/2).

Directly prior to the reading out of a memory cell the respective precharge-/equalize circuit 32, 14 is switched off.

By use of the above isolation circuits 8, 9, the read amplifier 1 during the reading out of a memory cell (e.g., the memory cell 22a) is decoupled from the side/bit line section that is not connected to memory cells to be read out, and is coupled with the side/bit line section that is connected to memory cells (e.g., the memory cell 22a) to be read out.

The actual reading out of the memory cell (e.g., the memory cell 22a) is initiated shortly thereafter by connecting through—as mentioned above—the respective access transistor (e.g., the transistor 22) connected with the respective capacitor (e.g., the capacitor 21) by activating the respective word line (e.g., the word line 33).

Subsequently, appropriate activating voltages are applied to the read amplifier 1, whereupon the read amplifier 1 amplifies the potential differences transferred from the respective capacitor 21, and outputs a respective amplified differential signal.

The respective amplified differential signal is transmitted from the read amplifier 1 to the above pair of local data lines 101, 102.

To connect the above pair of local data lines 101, 102 to the read amplifier 1, the above control signal CSL present on the CSL control lines 105, 106 is driven from a logic low to a logic high state (here, as will be described in further detail below, a first logic high state different from a second logic high state), such that the respective transistors 103, 104 ("bit switches") are connected through.

The above amplified differential signal is then transmitted from the above pair of local data lines 101, 102 to respective global data lines (in particular, to an associated pair of global data lines 107, 108 (see FIG. 2)), and hence to a further amplifier (so-called "secondary sense amplifier") for further amplification. Thereafter, the above control signal CSL present on the CSL control lines 105, 106 is again driven from the above (first) logic high to the above logic low state, such that the respective transistors 103, 104 ("bit switches") again disconnect the above pair of local data lines 101, 102 from the read amplifier 1.

To write data onto a memory cell (e.g., the memory cell 22*a*) ("write access") substantially an inverse process from the one described above is performed (which is well known in the art, and hence not described herein in detail).

In short, a respective differential signal is transmitted from the respective global data line 107, 108 to the respective pair of local data lines 101, 102.

Then, the above control signal CSL present on the CSL control lines 105, 106 is driven from the above logic low to a logic high state (here, as will be described in further detail below, the above second logic high state different from the above first logic high state), such that the respective transistors 103, 104 ("bit switches") are connected through.

Thus, the pair of local data lines 101, 102 is connected with the above read amplifier 1, and the above differential signal present on the pair of local data lines 101, 102 is transmitted to the read amplifier 1 (and, subsequently, to the respective memory cell 22*a* selected by activating a respective one of the above word lines 33).

Thereafter, the above control signal CSL present on the CSL control lines 105, 106 is again driven from the above (second) logic high to the above logic low state, such that the respective transistors 103, 104 ("bit switches") again disconnect the above pair of local data lines 101, 102 from the read amplifier 1.

Figure 3:
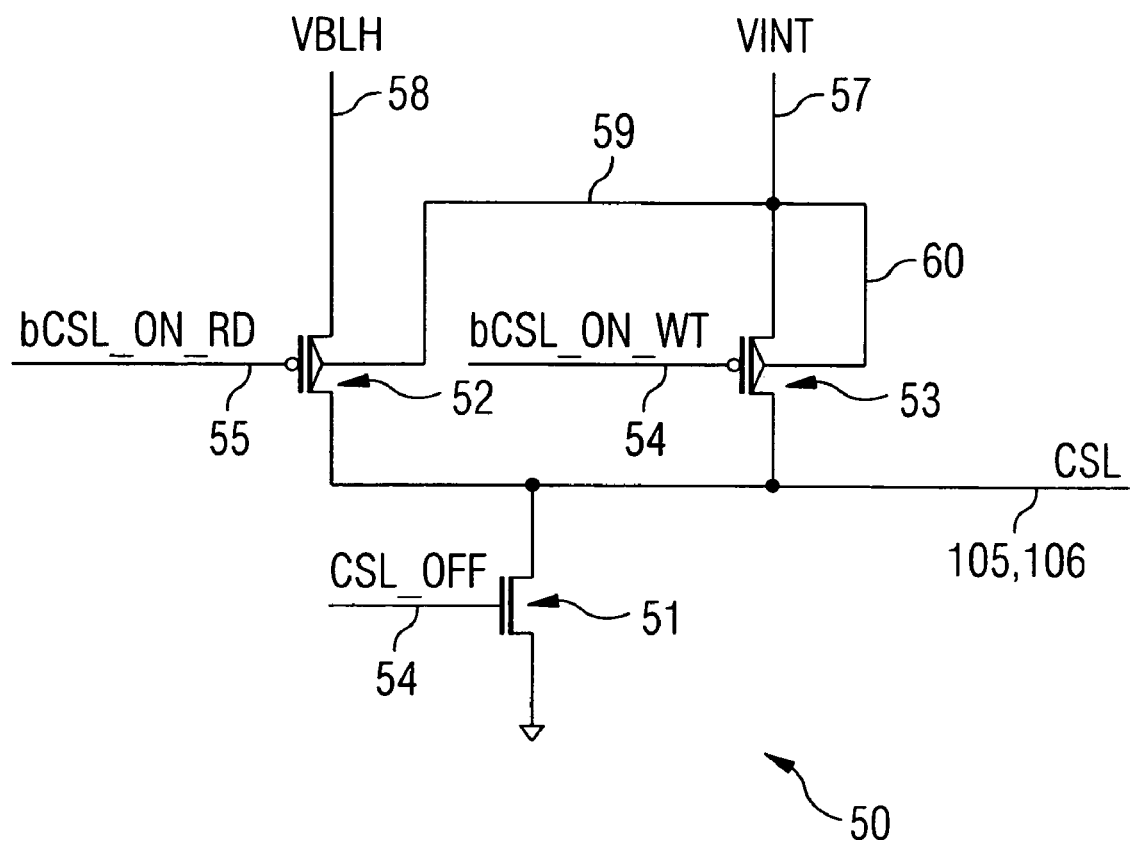
FIG. 3 shows a driver circuit used for driving the CSL control signal supplied to the bit switches shown in FIG. 1.

According to the present embodiment, for driving the above control signal CSL via the line 105 (and/or the line 106) to the gate of the above transistor 103 (and/or the above transistor 104) ("bit switches") a driver circuit 50 as shown in FIG. 3 is used. Corresponding, further driver circuits built similarly as the driver circuit 50 shown in FIG. 3 might be used to drive the further CSL control lines/pairs of CSL control lines mentioned above.

As will be described in further detail below, the driver circuit 50 shown in FIG. 3 is a tri-state driver circuit, capable of driving the control signal CSL either to the above logic low state (here, e.g. 0V or ground), or to the above first logic high state (here, e.g. the voltage VBLH or appr. VBLH), or to the above second logic high state different from the first logic high state (here, e.g. the voltage VINT or appr. VINT).

Advantageously, the voltage level (e.g. VBLH or appr. VBLH) of the control signal CSL in the above first logic high state is smaller than the voltage level (e.g. VINT or appr. VINT) of the control signal CSL in the above second logic high state.

The driver circuit 50 (and the further driver circuits mentioned above) might e.g. be arranged in the column decoder region 701 shown in FIG. 2.

As is shown in FIG. 3, the driver circuit 50 comprises three transistors 51, 52, 53, here: two PMOS-FETs 52 and 53 and an NMOS-FET 51.

The PMOS-FETs 52 and 53 are connected in parallel, and the parallel connection of the PMOS-FETs 52 and 53 is connected in series with the NMOS-FET 51.

In further detail, one end of the source-drain path of the NMOS-FET 51 is connected to ground, and the other end of the source-drain path of the NMOS-FET 51 is connected with an end of the source-drain path of the PMOS-FET 52, with an end of the source-drain path of the PMOS-FET 53, and with the above control line 105 (and/or 106) on which the above control signal CSL is driven.

The other end of the source-drain path of the PMOS-FET 52 is connected to a power supply line 58 to which a voltage with a first voltage level (here: the above voltage VBLH) is supplied.

Correspondingly, the other end of the source-drain path of the PMOS-FET 53 is connected to a power supply line 57 to which a voltage with a second voltage level different from the first voltage level (here: the above voltage VINT) is supplied.

The second voltage level of the voltage applied to the power supply line 57 (here: e.g. VINT) preferably is higher than the first voltage level of the voltage applied to the power supply line 58 (here: e.g. VBLH).

For instance, the above first voltage level of the voltage applied to the power supply line 58 might correspond to the above voltage level of a bit line in a logic high state (i.e., VBLH), and the above second voltage level of the voltage applied to the power supply line 57 e.g. to the above voltage level of the voltage VINT generated internally on the DRAM chip, and e.g. used for biasing the gates of the transistors 10, 11, 12, 13 of the isolation circuits 8, 9 outside a read or write access (the voltages VBLH and VINT being described in further detail in the above book "VLSI Memory Chip Design" by Kiyoo Itoh, Publishing House Springer, Berlin, Heidelberg, New York, 2001, with the respective sections of this book being expressly incorporated in this description by reference.).

As can be further seen from FIG. 3, the gate of the NMOS-FET 51 is connected to a control line 54 to which a control signal CSL_OFF might be applied.

In addition, the gate of the PMOS-FET 52 is connected to a control line 55 to which a control signal bCSL_ON_RD might be applied, and the gate of the PMOS-FET 53 is connected to a control line 56 to which a control signal bCSL_ON_WT might be applied. Still further, advantageously, further gates of the PMOS-FETs 52, 53 might be connected via respective lines 59, 60 to the above power supply line 57 (and the source-drain path of the PMOS-FET 53).

As was said above, at the beginning of a read access, the control signal CSL present on the CSL control line 105, 106 is driven to the logic low state. For this purpose, a respective control circuit (not shown herein, and e.g. located in the above column decoder region 701) applies a logic high control signal CSL_OFF to the control line 54, a logic high control signal bCSL_ON_RD to the control line 55, and a logic high control signal bCSL_ON_WT to the control line 56 (such that the source-drain path of the NMOS-FET 51 is connected through, and the PMOS-FETs 52 and 53 are shut off such as to disconnect the CSL control line 105, 106 from the respective power supply lines 58, 57).

Thereafter, as said above, the control signal CSL present on the CSL control line 105, 106 is driven to the above first logic high state. For this purpose, the above control circuit (not shown herein) applies a logic low control signal CSL_OFF to the control line 54, a logic high control signal bCSL_ON_WT to the control line 56, and a logic low control signal bCSL_ON_RD to the control line 55 (such that the source-drain path of the PMOS-FET 52 is connected through, and the NMOS-FET 51 and the PMOS-FET 53 are shut off so as to connect the CSL control line 105, 106 to the power supply line 58, and to disconnect the CSL control line 105, 106 from the power supply line 57).

Afterwards, at the end of a read access (and as was said above also), the control signal CSL present on the CSL control line 105, 106 again is driven to the logic low state. For this purpose, the above control circuit (not shown herein) again applies a logic high control signal CSL_OFF to the control line 54, a logic high control signal bCSL_ON_RD to the control line 55, and a logic high control signal bCSL_ON_WT to the control line 56.

Correspondingly, and as was said above, at the beginning of a write access, the control signal CSL present on the CSL control line 105, 106 is driven to the logic low state also. For this purpose, the above control circuit applies a logic high control signal CSL_OFF to the control line 54, a logic high control signal bCSL_ON_RD to the control line 55, and a logic high control signal bCSL_ON_WT to the control line 56 (such that the source-drain path of the NMOS-FET 51 is connected through, and the PMOS-FETs 52 and 53 are shut off such as to disconnect the CSL control line 105, 106 from the respective power supply lines 58, 57).

Afterwards, and different from what was said above with respect to a read access, in the middle of a write access the control signal CSL present on the CSL control line 105, 106 is driven to the above second logic high state. For this purpose, the above control circuit (not shown herein) applies a logic low control signal CSL_OFF to the control line 54, a logic high control signal bCSL_ON_RD to the control line 55, and a logic low control signal bCSL_ON_WT to the control line 56 (such that the source-drain path of the PMOS-FET 53 is connected through, and the NMOS-FET 51 and the PMOS-FET 52 are shut off so as to connect the CSL control line 105, 106 to the power supply line 57, and to disconnect the CSL control line 105, 106 from the power supply line 58).

Thereafter (i.e., at the end of a write access (and as was said above also)), the control signal CSL present on the CSL control line 105, 106 again is driven to the logic low state. For this purpose, the above control circuit (not shown herein) again applies a logic high control signal CSL_OFF to the control line 54, a logic high control signal bCSL_ON_RD to the control line 55, and a logic high control signal bCSL_ON_WT to the control line 56.

By using a relatively high voltage for the control signal CSL used for connecting through the transistors 103, 104 ("bit switches") during a write access, and using a relatively low voltage for the control signal CSL used for connecting through the transistors 103, 104 ("bit switches") during a read access, the write operation may be performed safely whilst the risk of a data corruption during the read operation is limited.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention is not be limited to the particular embodiment disclosed, but that the invention will include all embodiments falling within the scope of the appended claims.

What is claimed is:

1. A semiconductor memory comprising at least one memory cell adapted to store a data value, and adapted to be connected to a data line through a shared sense amplifier, the amplifier adapted to be connected to the data line through a switch device controlled by a control signal, the memory further comprising a tri-state driver device for driving the control signal.

2. The memory of claim 1, wherein the control signal driven by the tri-state driver device is a CSL signal.

3. The memory of claim 1, wherein the driver device comprises at least three transistors.

4. The memory of claim 3, wherein a first transistor is adapted to drive the control signal to a logic low voltage level.

5. The memory of claim 3, wherein a second transistor is adapted to drive the control signal to a first logic high voltage level.

6. The memory of claim 5, wherein a third transistor is adapted to drive the control signal to a second logic high voltage level different from the first logic high voltage level.

7. The memory of claim 4, wherein the first transistor is an NMOS field effect transistor.

8. The memory of claim 5, wherein the second transistor is a PMOS field effect transistor.

9. The memory of claim 6, wherein the third transistor is a PMOS field effect transistor.

10. The memory of claim 2, wherein the tri-state control signal is adapted to be switched between a first, a second and a third voltage level.

11. The memory of claim 10, wherein the first voltage level is a logic low voltage level.

12. The memory of claim 10, wherein the second voltage level is a first logic high voltage level, and the third voltage level is a second logic high voltage level different from the first logic high voltage level.

13. The memory of claim 10 wherein during a read operation the first logic high voltage level is used, and wherein during a write operation the second logic high voltage level is used.

14. The memory of claim 13 wherein the first logic high voltage level is lower than the second logic high voltage level.

15. The memory of claim 2 further comprising a further data line complementary to the data line, and a further switch device associated with the complementary data line, whereby the further switch device is controlled by the tri-state control signal, or a further tri-state control signal.

16. The memory of claim 1 wherein the switch device comprises a transistor.

17. The memory of claim 1 wherein the data line is a local data line.

18. The memory of claim 1 wherein the data line is adapted to be connected to a bit line.

19. The memory of claim 18 wherein the bit line is adapted to be connected to the memory cell.

20. The memory of claim 18 further comprising an amplifying device coupled between the bit line and the data line.

21. The memory of claim 1, said memory being a DRAM.

22. A method for operating a memory, comprising a memory cell adapted to store a data value, and adapted to be connected to a data line through a shared sense amplifier, the amplifier adapted to be connected to the data line through a switch device controlled by a control signal, the method comprising the steps:

driving the control signal at a first voltage level when a read operation is to be performed; and driving the control signal at a second voltage level different from the first voltage level when a write operation is to be performed.

23. The method of claim 22 wherein the first voltage level is lower than the second voltage level.

* * * * *